United States Patent
Tian et al.

(10) Patent No.: US 10,640,680 B2
(45) Date of Patent: May 5, 2020

(54) CHEMICAL-MECHANICAL PROCESSING SLURRY AND METHODS

(71) Applicant: Cabot Microelectronics Corporation, Aurora, IL (US)

(72) Inventors: Lu Tian, Singapore (SG); Ke Zhang, Singapore (SG); Andrew Haerle, Sutton, MA (US); Hon Wu Lau, Singapore (SG)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 15/951,358

(22) Filed: Apr. 12, 2018

(65) Prior Publication Data
US 2018/0298234 A1    Oct. 18, 2018

Related U.S. Application Data

(60) Provisional application No. 62/485,441, filed on Apr. 14, 2017.

(51) Int. Cl.
| | |
|---|---|
| *C09G 1/02* | (2006.01) |
| *H01L 21/321* | (2006.01) |
| *G11B 5/84* | (2006.01) |

(52) U.S. Cl.
CPC ............. *C09G 1/02* (2013.01); *G11B 5/8404* (2013.01); *H01L 21/3212* (2013.01)

(58) Field of Classification Search
CPC ...... C09G 1/02; G11B 5/8404; H01L 21/3212
See application file for complete search history.

(56) References Cited

U.S. PATENT DOCUMENTS

| | | | | |
|---|---|---|---|---|
| 4,950,555 | A * | 8/1990 | Michimori | G11B 5/64 428/836.3 |
| 5,685,947 | A | 11/1997 | Tseng et al. | |
| 2004/0259366 | A1* | 12/2004 | Kim | B24B 31/06 438/691 |
| 2006/0117667 | A1 | 6/2006 | Siddiqui et al. | |
| 2011/0209413 | A1 | 9/2011 | Nishida et al. | |
| 2014/0186585 | A1* | 7/2014 | Field, III | B24C 11/00 428/155 |
| 2015/0267083 | A1 | 9/2015 | Ward et al. | |
| 2016/0102227 | A1* | 4/2016 | Zhang | C09G 1/02 216/38 |

FOREIGN PATENT DOCUMENTS

| | | |
|---|---|---|
| JP | 10321569 A | 12/1998 |
| JP | 2009149493 A | 7/2009 |
| WO | 2016061116 A1 | 4/2016 |

OTHER PUBLICATIONS

Korean Intellectual Property Office as ISA, International Search Report issued in connection with Application No. PCT/US2018/027234 dated Aug. 9, 2018.
Taiwan Intellectual Property Office, Search Report issued in connection with Taiwan Patent Application No. 107112619 dated Oct. 31, 2018.

* cited by examiner

*Primary Examiner* — Duy Vu N Deo
(74) *Attorney, Agent, or Firm* — Thomas Omholt; Erika S. Wilson

(57) ABSTRACT

Described are chemical mechanical processing (CMP) compositions and related methods, including compositions and methods for polishing nickel-containing substrate surfaces such as nickel phosphorus (NiP) surfaces for hard disk applications, wherein the compositions contain highly irregular-shaped fused silica abrasive particles.

10 Claims, 3 Drawing Sheets

CHEMICAL-MECHANICAL PROCESSING SLURRY AND METHODS

FIELD OF THE INVENTION

The invention relates to chemical mechanical planarization (CMP) compositions and methods, including but not limited to compositions and methods for polishing nickel-containing surfaces (e.g., nickel-phosphorus (NiP) surfaces for hard disk applications), the compositions contain irregular-shaped fused silica abrasive particles.

BACKGROUND

The electronics and microelectronics industries rely on chemical mechanical planarization techniques for preparing sophisticated electronic devices that pervade our modern world. These include microprocessors and other integrated circuits that rely on silicon and other semiconductor materials; solid state and hard disk memory devices; optical materials and devices; and various other commercial and consumer electronic items.

One ubiquitous example is the hard magnetic disk, used for storing digital information in a manner that allows for highly efficient random access of the information. Hard disks now available for memory applications include multiple layers of different materials coated onto a rigid disk base. Each layer can have a different specialized function based on specific mechanical or magnetic properties of the material of the layer. One of the layers functions as a magnetic storage layer. But the other layers are also critical to reliable performance of the hard disk product, meaning that precision placement of each and every layer is essential in preparing the disk.

One layer that is common in a hard memory disk is a non-magnetic nickel layer, e.g., NiP, especially electroless NiP, which is present to provide hardness. The processed nickel layer is strong, hard, and can be processed to a highly smooth and uniform surface that allows the nickel layer to serve as a base for added magnetic and other layers. See, e.g., U.S. Pat. No. 6,977,030. The nickel layer can be provided by electroless plating and may be referred to as "electroless" NiP. See, e.g., U.S. Pat. No. 6,410,104.

The nickel layer as applied will have surface properties (roughness, micro-waviness, flatness) that are not immediately suitable for further processing into a hard disk, such as by applying additional constituent layers of the multi-layer hard disk. Current manufacturing techniques include processing the surface of an applied nickel layer by chemical mechanical processing to improve the surface properties, especially smoothness (i.e., reduced roughness and micro-waviness), before depositing additional layers of a hard disk product.

In processing the surface, various CMP techniques, abrasive particles, and chemicals have been used. Important factors in methods for preparing the nickel layer surface include a relatively high removal rate (to maintain processing throughput and an adequate cost of operation) and highly uniform resultant surface properties with a low level of scratching.

Balancing factors of removal rate and highly refined surface properties leads to different processing options, such as using relatively hard abrasive particles to provide higher removal rates, but which can produce excessive scratching, versus using softer particles that provide less scratching but have a lower removal rate. Sometimes, multiple separate steps are used including a first step that uses hard abrasive particles to affect a high removal rate, followed by at least one subsequent step using softer particles that have a lower removal rate but provide a more gentle (fine) process and a final, low roughness, low scratch surface. The first step may include the use of one or more of: hard abrasive particles (e.g., alumina particles), relatively large abrasive particle size, a relatively hard CMP pad, and relatively high pressure between the pad and the nickel layer surface during processing. In a subsequent (fine) step designed to provide a finished (low roughness) surface at a relatively lower removal rate, generally smaller sized and softer (e.g., silica) particles may be used along with lower pad pressure and a relatively softer CMP pad. Ultimately the nickel layer surface exhibits a low roughness, low micro-waviness, and a low level of scratching, to which subsequent layers may be applied.

Many slurries used for processing a nickel phosphorus surface contain alumina or a mixture of alumina and colloidal silica as abrasive. Alumina is more typically used for achieving a relatively high removal rate, such as in a first or early step. But due to the hardness of alumina, these abrasive particles can become embedded in a surface of the nickel layer during processing, forming an embedded (alumina) particle defect. The alumina abrasive particle can remain embedded in the nickel layer throughout subsequent processing, eventually forming a surface protrusion in a finished hard magnetic disk surface. During use of the hard magnetic disk product, the surface protrusion can directly cause a head crash as a magnetoelectric read or write head flies over the magnetic disk surface, contacting the surface protrusion.

One way to eliminate embedded particle defects and their associated potential for causing a head crash is to use CMP processes and slurries that have a reduced need for alumina particles, by developing abrasive slurries that contain a reduced amount of alumina abrasive particles, preferably even slurries that contain no alumina particles (i.e., "alumina-free" slurries). Yet high manufacturing throughput and commercially-feasible cost of ownership requirements ensure that high removal rate remains a high priority in processing a nickel layer of a hard disk. Slurries that contain only silica as abrasive particles ("silica-only" slurries) have been studied as one possible solution to embedded particle defects. At present, however, removal rates (of NiP) using slurries that contain only silica abrasive particles remain low compared to alumina-containing slurries.

SUMMARY

The following describes new and inventive methods and related slurries that can be used for processing a CMP substrate, for example a nickel (e.g., electroless nickel phosphorus) surface of a CMP substrate. The slurries can be referred to as "slurry compositions," "CMP slurries," "abrasive slurries," or simply as a "slurry" or "composition," or the like. A "CMP process" includes steps of bulk removal of material, planarization, polishing, or other steps of processing a surface of a CMP substrate by chemical mechanical processing.

Methods as described are for chemical-mechanical processing a surface of a CMP substrate, for example a surface of a nickel layer, by contacting the substrate surface with abrasive slurry and a pad, with pressure and motion between the pad and the substrate surface, to chemically and mechanically remove material from the substrate surface. The inventive slurries contain highly irregular-shaped silica (e.g., fused silica,) particles. The inventive methods and related slurries can be useful for treating a CMP surface at any stage of preparation, including treating a nickel surface (with the nickel surface being in the form that the nickel surface has upon being deposited onto a substrate) in a bulk removal step that is performed after depositing the nickel material onto the substrate, and prior to a polishing step that is performed on the nickel surface after the bulk removal step.

According to the invention, Applicant has discovered that highly irregular-shaped abrasive particles are effective for use in a slurry for chemical-mechanical processing of a substrate surface, either alone or in combination with other ("additional") abrasive particles. The highly irregular-shaped particles may be either a primary abrasive or a secondary abrasive particle of the slurry. The highly irregular-shaped particles provide effective or advantageous removal rate of material from the substrate surface, allowing for the slurries to be useful in a bulk removal step (i.e., as a "bulk slurry"). Useful highly irregular-shaped particles may be silica, e.g., fused silica, and the slurry can optionally include not more than an insubstantial amount of non-silica-based particles such as alumina particles, and can preferably exclude alumina particles.

As used herein, when referring to "particles" or a particle type that is present in the slurry, e.g., a "primary particle" or a "secondary particle," the present description refers to particles that are identifiable as a collection of a very large number of particles that are considered or used as a single ingredient or raw material for combining with other materials to prepare the slurry. The "particles" have one or more physical features that are measurable or detectable as features of the individual particles of the collection, including certain common features shared by substantially all of the individual particles in the collection, e.g., particle composition (e.g., silica), average particles size of the particles of the collection, method of preparation (e.g., colloidal silica, fumed silica), shape of the particles, among others. Certain types of features such as shape or composition are present in all or substantially all (e.g., at least 99, 99.5, 99.9 or 99.95 percent, based on total particles) of the individual particles of the collection. Other features, as will be understood to the skilled artisan, are measured as an average or mean of a representative sample of the particles of the collection, such as average or mean particle size. The term "particles" can be specifically used to refer to collections of such individual particles that are part of a single ingredient, raw material, or particle type, or a mixture of ingredients, raw materials, or particle types, that may be available or identifiable as a commercially available or specially prepared collection of particles adapted to be included as a collection, as an ingredient of a CMP slurry. When made available commercially, the features of "particles" such as particles size (average, mean, etc.), particle composition, and shape, etc., may be determined and reported for the collection of individual particles.

The slurry can also include oxidizing agent (e.g., hydrogen peroxide), an optional catalyst that includes a metal ion capable of reversible oxidation and reduction in the presence of nickel-phosphorus and oxidizing agent (e.g., hydrogen peroxide), optional catalyst stabilizing agent, optional nickel complexing agent, and other optional chemical or abrasive materials that may be included to improve the CMP process by increasing removal rate or otherwise chemically assisting in providing a desired or improved surface property of the processed nickel-phosphorus surface.

The slurry may contain only irregular-shaped abrasive particles as described (e.g., highly irregular-shaped fused silica particles), or may include additional abrasive particles that may be present in a greater or lesser amount relative to the amount of irregular-shaped particles. Certain slurry embodiments can be alumina free, meaning that the slurry contains abrasive particles that include no alumina particles or that include only a low or an inconsequential amount of alumina particles such as less than 3, 2, 1, or 0.5 weight percent alumina particles based on total weight abrasive particles. In these or other slurry embodiments, the abrasive particles of a slurry may be entirely silica or silica-based, or may be substantially silica or silica-based, meaning that the slurry contains abrasive particles that are at least 90, 95, 98, 99, 99.5, or more weight percent silica or silica-based particles, and not more than a low or inconsequential amount of non-silica or silica-based particles such as less than 10, 5, 2, 1, or 0.5 weight percent non-silica or silica-based particles, based on total weight abrasive particles in the slurry.

In one aspect the invention relates to a chemical-mechanical planarization slurry that contains: liquid carrier, abrasive particles comprising highly irregular-shaped fused silica particles, and optional oxidizing agent.

In another aspect the invention relates to a method of treating a CMP substrate surface. The method includes: providing a substrate having a CMP substrate surface; providing slurry that contains: liquid carrier, highly irregular-shaped fused silica particles, and optional oxidizing agent; and contacting the substrate surface with the slurry to remove material from the surface.

DETAILED DESCRIPTION

The following describes new and inventive CMP slurries that can be used for chemical-mechanical processing of a surface of a CMP substrate, such as a surface that includes nickel material, one example of a nickel material being nickel-phosphorus (e.g., electroless nickel phosphorus), as an exposed surface of a layer of a CMP substrate (sometimes referred to as a "nickel layer"). The slurries contain liquid carrier (e.g., water, organic solvent, or both), silica abrasive particles that include highly irregular-shaped fused particles, optional additional abrasive particles, oxidizer (at the point of use and, optionally, previous to that), and may contain one or more other optional ingredients useful for processing a CMP substrate by CMP processing.

Methods as described are useful for chemical-mechanical processing of a surface of a CMP substrate, e.g., a nickel layer, by contacting the surface with slurry as described herein and a pad, with pressure and motion between the pad and the surface, to chemically and mechanically remove material from the substrate surface. The described inventive methods and slurries can be useful for CMP processing at any stage of preparation of a CMP substrate. Example methods are for processing a nickel surface that is in a form in which the nickel surface was deposited onto a substrate by way of a preceding deposition step, for example for processing a substrate surface (e.g., a nickel surface) in a step that is sometimes referred to as a "bulk removal step."

According to the invention, Applicant has discovered that highly irregular-shaped fused silica abrasive particles are useful or advantageous as abrasive particles in a chemical-mechanical processing slurry for processing a CMP substrate. In particular examples, these slurries (due to the presence of highly irregular-shaped abrasive particles) have been found to provide a commercially useful or even a relatively high removal rate of material from a CMP substrate surface, e.g., from a nickel surface, making the slurries useful in a bulk removal CMP process step.

Figure 1:
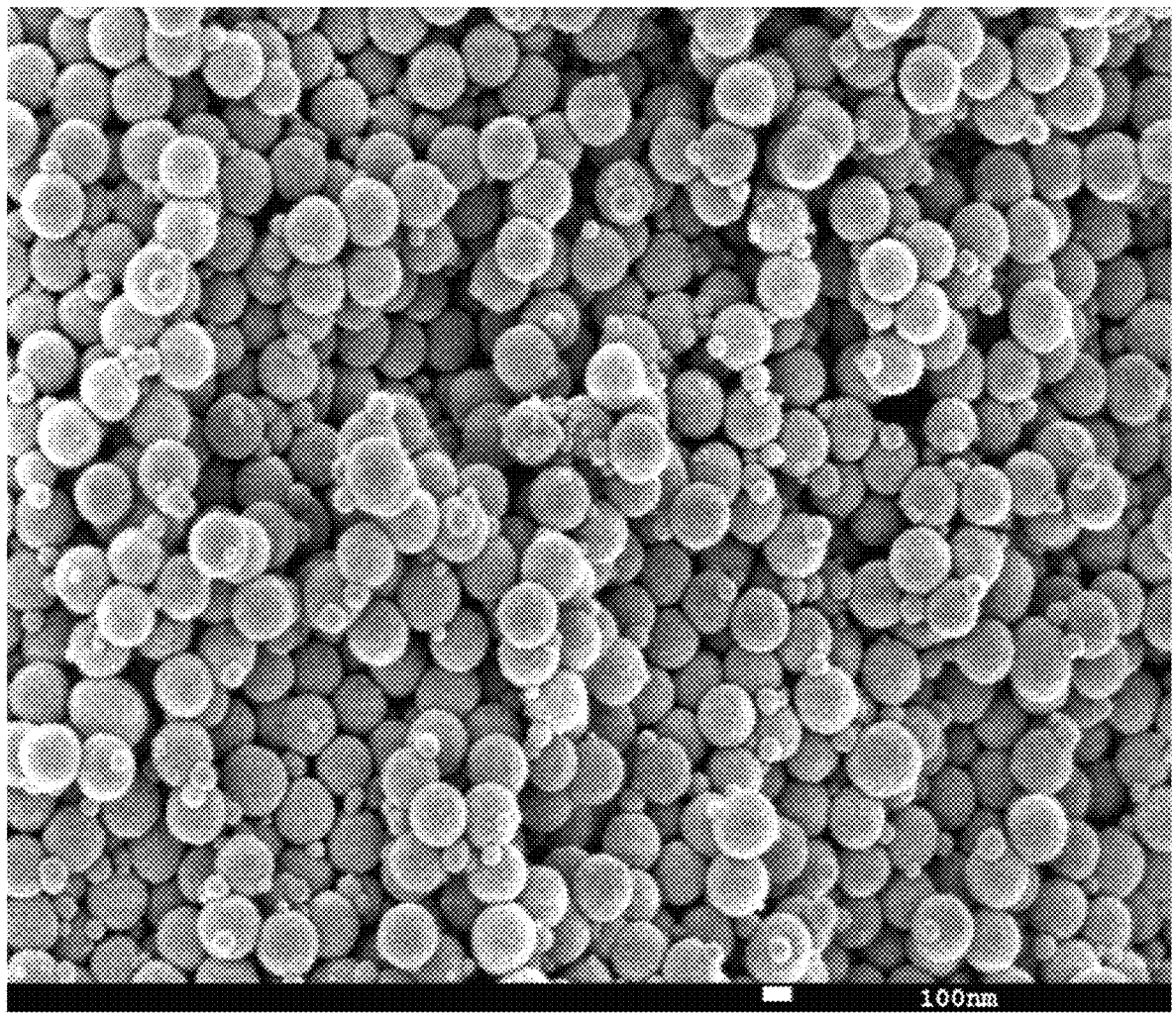
FIG. 1 is a photomicrograph of spherical silica abrasive particles.

According to various inventive embodiments, highly irregular-shaped silica abrasive particles may be distinguished from "rounded" silica abrasive particles, various embodiments of which are previously known to be useful in CMP slurries. As used herein, the term "rounded particles" refers to particles that are essentially entirely rounded over their surfaces and appear (e.g., in a photomicrograph) to be relatively smooth, meaning that the particles are substantially rounded, curved, and smooth, in their cross-sectional shape in three (orthogonal) dimensions, as expected with respect to previously-known rounded CMP abrasive particles. See FIG. 1, showing examples of rounded silica abrasive particles that are also spherical. At FIG. 1, the rounded silica abrasive particles do not contain a substantial amount of rough, sharp, or jagged corners, edges, or points, and are not highly elongate, e.g., do not exhibit an aspect ratio that is greater than 4:1, e.g., greater than 5:1, in at least one cross sectional profile. Rounded particles include various previously-known CMP abrasive particles that are considered in the CMP processing or abrasive particles arts to be spheres, spheroids, ellipsoids, ovoids, or even slightly oblong particles that may be referred to as "cocoon-shaped" or "potato-shaped" abrasive particles. Various examples, including commercial examples, of rounded silica abrasive particles have been previously-used, e.g., conventionally used, in past CMP processes.

One specific type of rounded silica abrasive particles is "spherical particles." As used herein, "spherical particles" are particles that are considered to be essentially entirely round and smooth over their entire particles surfaces, and spherical (meaning, in three-dimensions, having every point on a surface being essentially equidistant from a center), i.e., a spheroid. The spherical particles can typically be a collection of particles that will also include particles that are slightly (or more-than-slightly) non-spherical but can still be considered in the CMP abrasive particle arts to be substantially spherical in shape; such particles may be not perfectly spherical but may still exhibit cross-sectional symmetry in three (orthogonal) dimensions, e.g., may be oblate or prolate; such particles may furthermore have a maximum aspect ratio of two dimensions of a cross section of the particles that is in a range from 80:120 to 120:80, e.g., in a range from 90:100 to 100:90, or from 95:105 to 105:95.

Examples of previously-known rounded silica particles are commercially available from companies that include Akzo Nobel (Amsterdam, Netherlands), Nissan Chemicals (Houston, Tex.), Fuso, Nalco, and others. Non-limiting examples of colloidal silica particles that are considered to be spherical in shape include the following commercial particle products: Bindzil 40/130 (Akzo Nobel); Nalco 13573 (Nalco); Bindzil 40/170; Nalco 2360; Bindzil 50/80; Nalco 2329K; Nissan ST-50, ST-20L, ST-XL; Fuso PL-1, PL-3, and PL-7, and JGC C&C SI-50, SI-45P, SI-80P, and SS-160 etc.

Figure 2:
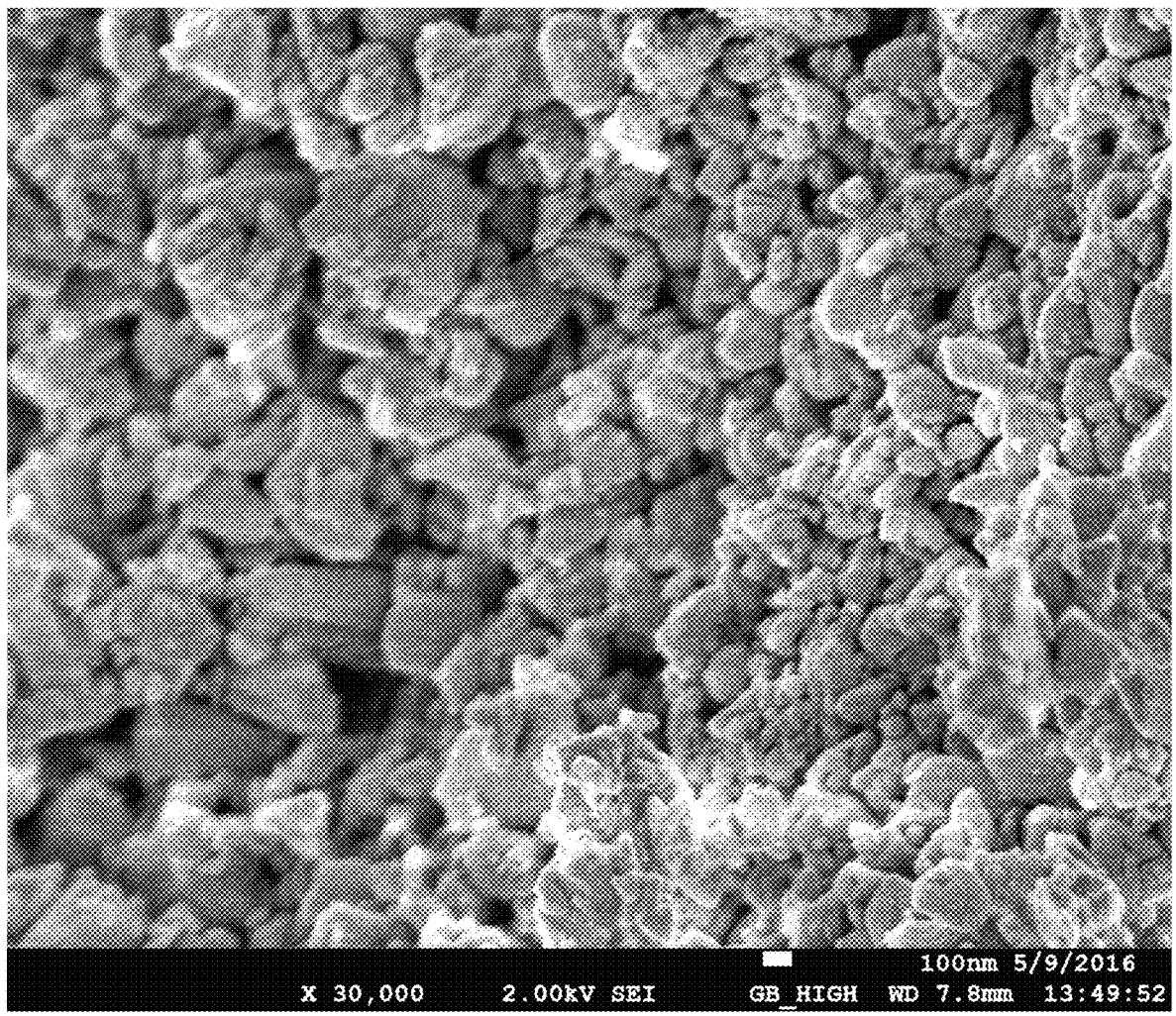
FIG. 2 is a photomicrograph of highly irregular-shaped fused silica abrasive particles.

As opposed to rounded particles, highly irregular-shaped particles, as that term is used herein, include particles that are different from "rounded" particles, and that as a collection of particles exhibit varied forms and differing shapes and geometries, including a substantial amount of asymmetry. As opposed to entirely rounded surfaces and mostly symmetric cross-sections, the highly irregular-shaped particles include particles that exhibit a substantial amount of cross-sectional asymmetry, e.g., that have substantial portions of their surfaces and edges that (when viewed in a photomicrograph) are flat, bumpy, angled (angular or cornered), rough, or irregular, with flat, jagged, angled, or fractured surface features and non-rounded (e.g., linear, jagged, angular, rough, or cornered) edges of the surfaces, including particles that include a substantial or a high amount (proportionally) of non-rounded, rough, jagged, or fractured surfaces and edges. FIG. 2 shows an example of highly irregular-shaped fused silica particles.

One example of a specific type of highly irregular-shaped abrasive particles is what will be referred to herein as highly-irregular fused silica abrasive particles. These include silica abrasive particles that have varied particle shapes and geometries, such as a relatively high amount (proportionally) of non-rounded (e.g., planar, jagged, fractured, or flat) surfaces with angled or cornered edges, a high degree of cross-sectional asymmetry, and irregular (rough, non-linear, non-planar, or bumpy) surfaces and edges; e.g., at least half of the surfaces, or at least 60, 70, or 80 percent of identifiable surfaces of the particles are non-rounded, non-smooth, bumpy, or rough, as compared to rounded particles, and have a cornered or angular edge. See FIG. 2, which shows an example of highly-irregular fused silica abrasive particles.

Highly irregular-shaped fused silica particles may be prepared, for example, by methods already known for preparing fused silica particles, including producing pieces of fused silica, processing the pieces into smaller pieces, e.g., nanoparticles, and sorting or classifying the smaller pieces to isolate particles of a desired size or within a desired size range, such processing including synthesizing fused silica pieces or particles, milling the synthesized pieces or particles into smaller pieces, eventually forming particles of a nanoparticle scale, and then classifying the nanoparticles to a desired size or size range.

Various methods of synthesizing fused silica from sand or other raw materials are known. One general example of a process for preparing irregular-shaped fused silica particles (i.e., nanoparticles) is a "top down" method, which starts with large scale pieces (bulk) of silica and processes the bulk pieces by breaking down the size of the bulk pieces into smaller and smaller pieces, eventually to nanoparticles, then classifying or sorting the nanoparticles to a desired size range for use in a slurry as described herein. Another example of a useful type of method for preparing silica nanoparticles is a "bottom up" method, which starts at an atomic level, preparing silica particle nucleuses and then growing the silica particle nucleuses into nanoparticles by wet chemical synthesis, gas condensation, or self-assembly etc.

The highly irregular-shaped abrasive particles can have any useful size, meaning a size that, when the highly irregular-shaped abrasive particles are contained in a slurry, the slurry is useful as described herein, preferably providing a desired or advantageous removal rate of material from a CMP substrate surface during a CMP process step, e.g., providing a useful or advantageous removal rate of nickel-containing material from a nickel-containing substrate in a CMP process step such as a bulk removal step. Example highly irregular-shaped abrasive particles can have an average particle size of below 2000 nanometers, e.g., below 1200 nanometers (nm), below 1000 nm, for example an average particle size in a range from 50 or 100 nanometers to 700 or 800 nanometers, e.g., in a range from 200 or 300 to 800 nanometers, such as from 350 or 400 to 600 nanometers. Average particle size of abrasive particles can be measured using a dynamic light scattering (DLS) tool such as the Zetasizer® available from Malvern Instruments® (Worcestershire, UK). Particle size distributions of abrasive particles, e.g., in a slurry as described, can be identified by static light scattering, using known equipment and methods, such as a model LA-910 from Horiba Instruments, Irvine Calif.

Preferred highly irregular-shaped fused silica particles for use in a slurry as described can also have a particle density (as opposed to an "apparent" or "bulk" density) that is greater than a particle density of other certain other forms of silica used in abrasive particles, e.g., as compared to colloidal silica particles. Highly irregular-shaped fused silica is reported to have a density of about 2.2 grams per cubic centimeter, whereas the density of colloidal silica is reported at about 1.8 grams per cubic centimeter.

Moreover, preferred highly irregular-shaped fused silica particles for use in a slurry as described can also have a hardness that is greater than a hardness of other certain other forms of silica used in abrasive particles, e.g., as compared to colloidal silica particles. Highly irregular-shaped fused silica is reported to have a hardness on a Mohs scale in a range from 5.3 to 6.5, whereas colloidal silica is reported to have a hardness of 5.5 on the Mohs scale of mineral hardness. Preferred highly irregular-shaped fused silica particles used in a slurry of the present description can have a Mohs hardness of greater than 5.5, e.g., greater than 5.6, e.g., in a range from 5.8 to 6.5 on a Mohs scale of mineral hardness.

Figure 3:
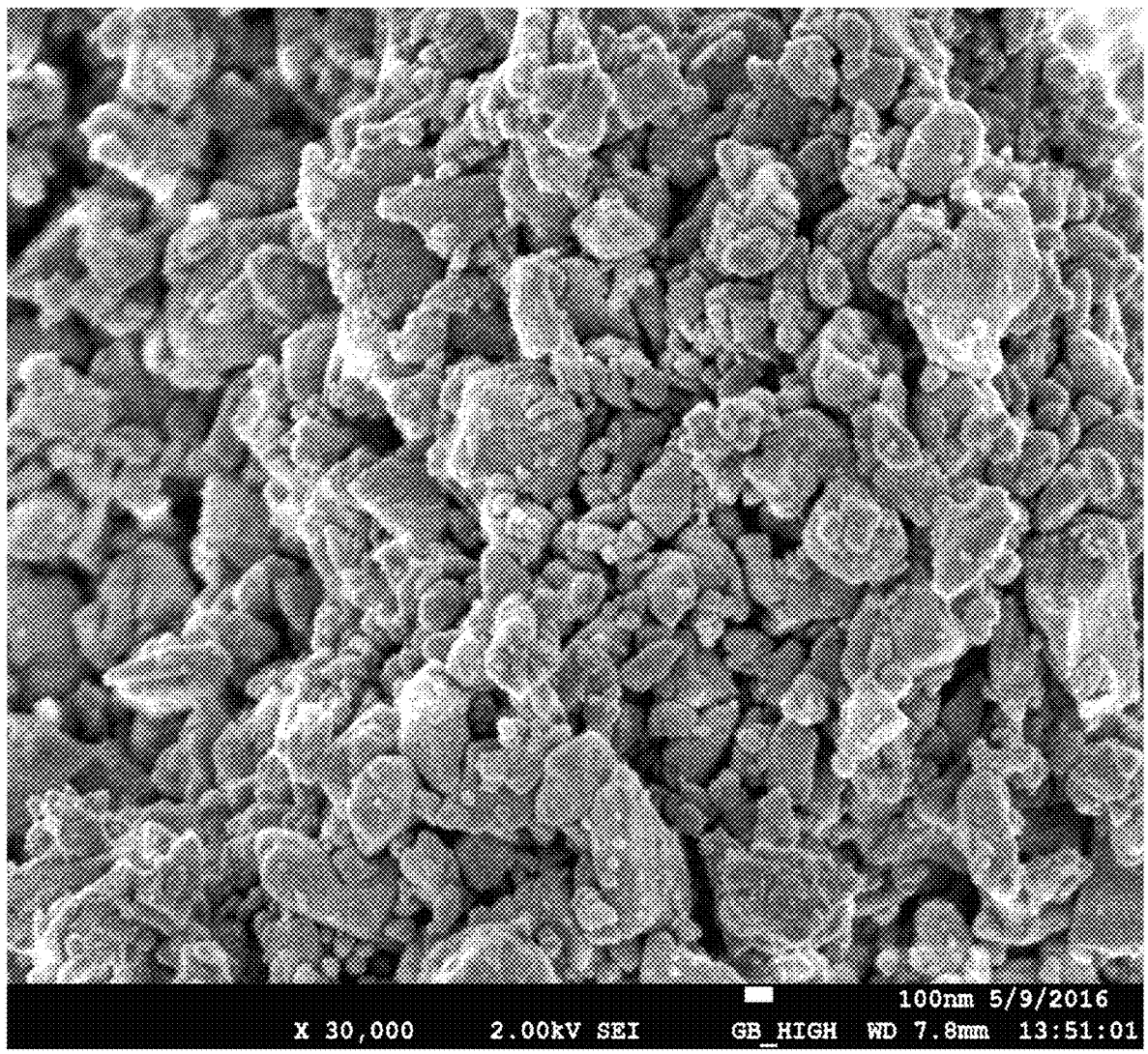
FIG. 3 is a photomicrograph of irregular shaped silica abrasive particles.

Highly irregular-shaped fused silica particles for use in a slurry as described may also be characterized in terms of shape factors. Shape factors may be obtained from automated or manual image analysis from scanning electron microscope (SEM) images. In one embodiment, a shape factor representing the diameter of the area equivalent circle (Dcircle) divided by the maximum dimension (Dmax) is an indicator of highly irregular-shaped fused silica particles. By definition, the area equivalent diameter is the diameter of a circle having the same projected area as the circle. The maximum dimension is the longest line that can be drawn between two points in the particle. A Dcircle/Dmax value of 1 would be a perfect circle, or perfectly spherical. The closer the Dcircle/Dmax value is to 1 would indicate that the morphology of the particle is more spherical, or closer to being a perfect circle. Additionally, with a circle, or spherical particles, the standard deviation of the Dcircle/Dmax observations is small. On the other hand, a particle that is highly irregular, the Dcircle/Dmax is less than, and further away from, 1.0, and the standard deviation is also bigger, when compared to spherical particles or irregular shaped particles (as shown in FIG. 3).

The highly irregular-shaped fused silica particles may be present in a slurry in any useful amount, such as an amount that, when the highly irregular-shaped fused silica are contained in a slurry, will cause the slurry to be useful as described herein, preferably providing a desired or advantageous removal rate of material from a CMP substrate surface during a CMP process step, e.g., providing a useful or advantageous removal rate of nickel material from a nickel substrate in a CMP process step such as a bulk removal step. Example amounts of highly irregular-shaped fused silica abrasive particles can be in a range of up to about 15 or 20 weight percent, based on total weight of a slurry (at a point of use), e.g., from 0.5 or 1 to 12 weight percent such as from 2 to 10 weight percent, based on total weight of a slurry, at a point of use. Amounts of the highly irregular-shaped fused silica particles will be higher in a slurry concentrate by an amount that corresponds to a reduced amount of liquid carrier in the slurry concentrate.

Relative to other ("additional") abrasive particles in a slurry, the presence of which is optional, the highly irregular-shaped fused silica particles may be present in any useful amount that is greater than zero. The highly irregular-shaped fused silica particles may be the only type of particle in the slurry, i.e., the slurry may contain at least 99, 99.5, or 99.9 weight percent highly irregular-shaped fused silica particles based on total weight abrasive particles in the slurry.

According to other slurry embodiments, the highly irregular-shaped fused silica particles need not be present as the only abrasive particle but may be included as a primary or secondary particle in a mixture of abrasive particles in the slurry. Thus, example slurries include an amount of highly irregular-shaped fused silica particles optionally in combination with one or more additional types of abrasive particles, with the highly irregular-shaped fused silica particles being present in a minor amount (relative to all abrasive particles), e.g., as a secondary abrasive particle, or in a major amount (relative to all abrasive particles), e.g., as a primary abrasive particle; the highly irregular-shaped fused silica particles may be a primary particle of a slurry, or a secondary particle, present in combination with one or more other types of abrasive particles, i.e., one or more types of "additional particles."

As used herein, the term "primary particles" (also, "primary abrasive particles") refers to particles that are present in a slurry in a major amount, meaning at a level of at least 50 percent by weight based on a total weight of all abrasive particles in the slurry, or in an amount by weight that is greater than an amount of any other single type of abrasive particles in the slurry. A primary abrasive particle, which may be a highly irregular-shaped fused silica particle or an "additional" particle as these terms are used herein, may be present in an amount of at least 50, 60, 70, 80, 90, 95, 99, 99.5, 99.9, or up to 100 weight percent based on the total weight of all abrasive particles in the slurry.

As used herein, the term "secondary particles" (also, "secondary abrasive particles") refers to abrasive particles that are in a slurry in a minor amount, meaning at a level that does not exceed 50 percent by weight, based on the total weigh of all types of abrasive particles in the slurry. A secondary abrasive particle may be present in a slurry in an amount that does not exceed 50, 40, 30, 20, 10, 5, 1, 0.5, or 0.1 weight percent, based on the total weight of all abrasive particles in the slurry. A slurry may contain one type of abrasive particle that is a secondary abrasive particle, or two or more different types of abrasive particles with each being a secondary abrasive particle relative to yet another type of abrasive particle in the slurry that would be considered the primary abrasive particle.

When included as part of a mixture of abrasive particles in a slurry, highly irregular-shaped fused silica particles may be present in any relative amount; example amounts of irregular-shaped fused silica abrasive particles relative to all types of abrasive particles in the slurry can be in a range of up to about 50, 60, 70, 80, or 90 parts by weight (pbw) highly irregular-shaped fused silica abrasive particles based on 100 parts by weight total abrasive particles in the slurry, e.g., from 2 to 50, or from 5 to 45, e.g., from 10 to 40 pbw highly irregular-shaped fused silica abrasive particles based on 100 parts by weight of all abrasive particles in the slurry (either at a point of use or in a slurry concentrate). Alternately stated, example amounts of highly irregular-shaped fused silica particles relative to all abrasive particles in a slurry can be in a range of up to about 50, 60, 70, 80, or 90 weight percent irregular-shaped abrasive particles, based on a total weight abrasive particles in a slurry, e.g., from 2 to 50, or from 5 to 45, e.g., from 10 to 40 weight percent highly irregular-shaped fused silica particles, based on total weight of all abrasive particles in the slurry (either at a point of use or in a slurry concentrate).

Optionally, in addition to the highly irregular-shaped fused silica particles, example slurries may contain one or more other types of particles (i.e., "additional particles" or "additional abrasive particles") that are present in the slurry in combination with the irregular-shape particles in any useful or desired amounts. Any one or more types of additional particle or particles may be present in a major amount relative to all abrasive particles in a slurry (e.g., as a primary abrasive particle) or in a minor amount relative all abrasive particles in a slurry (e.g., as a secondary abrasive particle) or relative to the amount of the irregular-shaped particles. The composition, size, size range, and other physical characteristics of the additional particles can be as desired and as will be considered to be useful for a particular CMP process or for processing a particular type of CMP substrate. Example additional abrasive particles may be made of silica, silicon nitride, a metal, a metal oxide, or one or more of various other silica or non-silica-based materials useful as CMP abrasive particles, including but not limited to colloidal silica, titanium oxide, thorium oxide, alumina, yttria, zirconia, diamond, ceria, etc. Certain specific additional particles for use in processing a nickel CMP substrate surface include silicon nitride as well as rounded silica-based particles such as colloidal silica particles (including but not limited to spherical colloidal silica particles, cocoon-shaped colloidal silica particles, etc.).

Certain preferred additional abrasive particles are silica or silica-based abrasive particles that may be composed of any type of silica or silica-based material that is presently known or that is developed in the future, and that can be prepared to exhibit size, shape, and other physical properties that will be useful in a particular CMP slurry, CMP process, or with a particular CMP substrate. Additional abrasive particles that are silica or silica-based can be prepared by any of various methods that are known to be useful for forming silica and silica-based particles to desired size and morphology properties, those methods including forming particles and optional sorting or classifying of particles to isolate those having a particular feature, such as average particle size.

In some slurries as described, examples of useful additional particles are particles that are round, for example particles that are spherical, preferred such particles being silica or silica-based and being made of any type of silica or silica-based material, such as fumed silica, fused silica, and colloidal (wet process) silica. These include precipitated or condensation-polymerized silica, which may be prepared using known methods, such as by methods referred to as the "sol gel" method or by silicate ion-exchange. Condensation-polymerized silica abrasive particles are often prepared by condensing $Si(OH)_4$ to form substantially spherical particles. The precursor $Si(OH)_4$ may be obtained, for example, by hydrolysis of high purity alkoxysilanes, or by acidification of aqueous silicate solutions. U.S. Pat. No. 5,230,833, the entirety of which is incorporated herein by reference, describes a method for preparing colloidal silica particles in solution.

The additional particles, of any type, can be of any useful size and size range, e.g., having an average particle size that is below 1000 nm, such as an average particle size in a range that is at least 40, 50, 60, or 70 nanometers, and not more than 600, 500, 300, or 200 nanometers.

Certain exemplary slurries can include the highly irregular-shaped fused silica particles in combination with additional particles that are rounded silica or silica-based abrasive particles, e.g., colloidal silica particles. More specific examples of such rounded particles include colloidal silica particles that are spherical, cocoon-shaped, or a combination thereof, and that may be of any useful or desired size. Spherical particles can have a spherical shape as described herein. Cocoon-shaped colloidal silica particle are rounded but oblong, e.g., prolate or ellipsoid, for example having an aspect ratio, in a plane that includes the elongate dimension of the particle, in a range from 1:2 to 1:4 or 1:3.5. Thus, example slurries can include additional particles that are rounded colloidal silica particles, e.g., spherical, cocoon-shaped, or a combination thereof. Such a slurry may contain any amount of the rounded particles relative to a total amount of all types of additional particles; for example the slurry may contain additional particles that are at least 80, 90, 95, 99, 99.5, 99.9, or 99.99 weight percent colloidal silica particles that are rounded, spherical, cocoon-shaped, or a combination of these, based on a total amount of additional particles in the slurry.

Examples of average particle sizes for colloidal silica particles as additional particles may be in a range from 40 to 200 nanometers, e.g., from 50 to 150 nanometers. Examples of average particles sizes for cocoon-shaped colloidal silica particles as additional particles may be in a range from 50 to 200 nanometers, e.g., from 70 to 180 nanometers, such as from 100 to 150 nanometers.

One or more types of additional particles may be present in a slurry in any useful amount (relative to the total slurry weight), meaning an amount that, when the additional particles are contained in a slurry with the highly irregular-shaped fused silica particles, the slurry is useful as described herein, preferably providing a desired or advantageous removal rate of material from a CMP substrate surface during a CMP process step, e.g., providing a useful or advantageous removal rate of nickel material from a nickel substrate in a CMP process step such as a bulk removal step. Example amounts of additional abrasive particles (i.e., particles other than highly irregular-shaped fused silica particles) in a slurry can be in a range of up to 20 weight percent, e.g., from 0.5 or 1 to 18 weight percent such as from 2 to 15 weight percent or from 2 to 10 weight percent, based on total weight of a slurry, at a point of use. In a slurry concentrate the amount will be larger in proportion to a reduced content of liquid carrier.

Relative to the highly irregular-shaped particles, an amount of "additional" particles in a slurry can be any amount considered to be useful; example amounts of additional abrasive particles (either a single type or a combination of two or more types of additional abrasive particles) can be in a range of up to about 50, 60, 70, 80, 85, 90, 95, 97, or 98 parts by weight (pbw) additional particles based on 100 parts by weight of all abrasive particles in the slurry, i.e., based on 100 parts by weight of the highly irregular-shaped particles and the additional particles in the slurry, e.g., from 2 to 98, or from 5 to 97, e.g., from 10 to 95 pbw additional particles based on 100 parts by weight of the total amount of additional particles and highly irregular-shaped fused silica particles in the slurry (either at a point of use or in a slurry concentrate). Thus, the additional particles may be a primary particle of a slurry, or a secondary particle, and a slurry may contain a single type of additional particles or more than one type of additional particles. Alternately stated, example amounts of the additional particles (of a single type or a combination of types of additional particles) relative to all abrasive particles (i.e., the highly irregular-shaped fused silica particles and any one or more additional particles) in a slurry can be in a range of up to about 50, 60, 70, 80, 85, 90, 95, 97, or 98 weight percent additional particles based on total weight abrasive particles in the slurry, e.g., from about 2 to about 98, or from about 5 to about 97, e.g., from 10 to 95 weight percent additional particles based on total weight particles in the slurry, meaning total weight of the additional particles (of a single type or more than one type) and the highly irregular-shaped fused silica particles (either at a point of use or in a slurry concentrate).

In particular embodiments, the additional particles can include silica or colloidal silica particles, with certain particularly-preferred slurry embodiments containing one or more types of additional particles that are entirely silica or colloidal silica, e.g., additional particles that are at least 99, 99.5, 99.9, or 99.99 weight percent silica, e.g., at least 99, 99.5, 99.9, or 99.99 weight percent colloidal silica based on the total weight of additional particles in the slurry. According to such slurry embodiments, a slurry may contain the highly irregular-shaped fused silica particles and an amount of additional particles that are silica or colloidal silica, with not more than an insubstantial amount of any other type of abrasive particles in the slurry. Examples of such slurries may contain at least 98, 99, 99.5, 99.9 or up to essentially 100 weight percent of the combined highly irregular-shaped fused silica particles and additional particles that are silica or colloidal silica (including mixtures thereof), based on total weight of all abrasive particles in the slurry. For example the slurry may contain no amount or substantially no amount of any other type of abrasive particles, e.g., less than 2, 1, 0.5, 0.1, or 0.05 weight percent of abrasive particles that are not either: the highly irregular-shaped fused silica abrasive particles as described; or additional particles that are silica, colloidal silica, or a combination of these.

Slurries as described (either a slurry that is a silica-only slurry, or a slurry that contains some amount of non-silica-based abrasive particles), do not require alumina particles and useful examples of such slurries can exclude the presence of any more than an insubstantial amount of alumina particles. Example slurries can contain not more than 3, 2, or 1 weight percent, e.g., not more than 0.5, 0.1, 0.05, or 0.01 weight percent alumina particles, based on total weight abrasive particles in the slurry. These slurries, especially slurries with no alumina particles, can be referred to as "no-alumina" or "alumina-free" slurries, and can be desired and advantageous because the absence of alumina abrasive particles eliminates the potential for embedded alumina particle defects and higher levels of scratching that can be caused by the presence of alumina particles during certain types of CMP processes.

Liquid carrier of the slurry facilitates application of the abrasive particles and chemical ingredients of the slurry to a surface of a substrate being processed. The liquid carrier may be any suitable carrier (e.g., solvent) such as a lower alcohol (e.g., methanol, ethanol, etc.), ether (e.g., dioxane, tetrahydrofuran, etc.), water, or a mixture thereof. Preferably, the liquid carrier comprises, consists essentially of, or consists of water, more preferably deionized water. A carrier that consists essentially of water can contain up to (not more than) 5, 3, 2, 1, 0.5, 0.1, or 0.05 weight percent non-water solvent such as a lower alcohol (e.g., methanol, ethanol, etc.), ethers (e.g., dioxane, tetrahydrofuran, etc.).

The slurry may typically be acidic during use in a CMP process, for example having a pH of not greater than about 3, e.g., not greater than about 2. A low pH of a slurry may be achieved or maintained by any suitable means. The slurry may include substantially any suitable pH adjusting agent or buffering system. For example, suitable pH adjusting agents include organic and inorganic acids such as nitric acid, sulfuric acid, phosphoric acid, phthalic acid, citric acid, adipic acid, oxalic acid, malonic acid, maleic acid, etc.

The slurry may include oxidizing agent, which may be added to the slurry during the slurry manufacturing process or just prior to a CMP operation, such as in a tank located at a point of use of the slurry. Exemplary oxidizing agents include inorganic and organic per-compounds. A per-compound as defined by Hawley's Condensed Chemical Dictionary is a compound that contains at least one peroxy group (—O—O—), or a compound that contains an element in its highest oxidation state. Examples of compounds that contain at least one peroxy group include hydrogen peroxide and its adducts such as urea hydrogen peroxide and percarbonates, organic peroxides such as benzoyl peroxide, peracetic acid, and di-t-butyl peroxide, monopersulfates ($SO_5^-$), dipersulfates ($S_2O_8^-$), and sodium peroxide. Examples of compounds that contain an element in its highest oxidation state include periodic acid, periodate salts, perbromic acid, perbromate salts, perchloric acid, perchlorate salts, perboric acid, and perborate salts and permanganates. An often-preferred oxidizing agent is hydrogen peroxide.

Oxidizing agent may be included in a slurry in any useful amount, including an amount useful to provide a desired removal rate of nickel-containing material from a surface of a nickel-containing layer of a substrate. Exemplary amounts at a point of use can be in a range from about 0.1 to about 10 weight percent based on total weight slurry, such as from about 0.1 to about 6 weight percent (e.g., from about 0.2 to about 5 weight percent, from about 0.3 to about 4 weight percent, or from about 0.5 to about 3 weight percent based on total weight slurry).

Oxidizing agent, may, if desired, be added at any time during the preparation of the slurry. For example, the slurry, containing oxidizing agent, may be prepared and sold and delivered for commercial use with oxidizing agent present in the slurry. Alternately, the slurry may be prepared, sold, and delivered, as a slurry that does not contain oxidizing agent. The slurry without oxidizing agent may be transported, stored, and delivered before commercial use without the oxidizing agent being added. Shortly before using the slurry in a CMP process, e.g., at or just prior to a point of use, oxidizing agent may be added to the slurry, for example within about 1 minute, or within about 10 minutes, or within about 1 hour, or within about 1 day, or within about 1 week of the CMP operation. The slurry may also be prepared by mixing the components at the surface of the substrate (e.g., on the polishing pad) during the CMP operation.

A metal ion accelerator optionally included in the slurry is a compound that contains a metal ion that is capable of reversible oxidation and reduction in the presence of a metal material (e.g., a metal, metal alloy, etc., such as nickel-phosphorus) at a surface of a CMP substrate, and an oxidizing agent (e.g., hydrogen peroxide). Any suitable metal ion accelerator may be included in a slurry as described. Preferred metal ions include ions of iron, cobalt, copper, europium, manganese, rhenium, molybdenum, iridium and tungsten. Non-limiting examples of such metal ions include $Fe^{2+}$, $Fe^{3+}$, $Co^{2+}$, $Cu^{2+}$, $Eu^{3+}$, $Mn^{2+}$, $W^{6+}$, $Re^{7+}$, $Mo^{5+}$ and $Ir^{3+}$. Preferably, the metal ion is or comprises $Fe^{3+}$. Typically, the metal ion is included in the CMP composition as a soluble salt, for example, a nitrate, a halide (e.g., chloride), a sulfate, or the like.

Metal ion accelerator may be optionally present in the slurry (at point of use) at a concentration of greater than about 1 ppm (e.g., about 5 ppm, about 10 ppm, about 20 ppm, about 50 ppm, about 100 ppm). The metal ion accelerator is, preferably, present in the composition (at point of use) at a concentration of less than about 1000 ppm (e.g., about 750 ppm, about 500 ppm, about 250 ppm, about 150 ppm, about 125 ppm). The metal ion accelerator may be present in the composition (at point of use) at a concentration range bounded by any of the aforementioned concentrations, for example, about 1 to about 1000 ppm, preferably about 20 to about 250 ppm, e.g., about 50 to about 150 ppm.

The slurry may optionally contain a stabilizing agent, which can function chemically with materials of the slurry and the substrate to improve a rate of removal of material from a substrate, e.g., by chelating (to a stabilizing degree) a metal ion of a metal ion accelerator. Example catalyst stabilizing agents include organic compounds that include two or three carboxylic acid substituents, and that are capable of chelating with a metal ion also present in the slurry. Non-limiting examples include oxalic acid, malonic acid, succinic acid, malic acid, tartaric acid, citric acid, glutaric acid, adipic acid, maleic acid, phthalic acid and iminodiacetic acid. The term "carboxylic acid" refers to the free acid form as well as a salt of a carboxylic acid (e.g., alkali metal salts).

The stabilizing agent can be present at a concentration of about 0.001 to about 2 weight percent, based on total weight slurry (at a point of use), e.g., from about 0.03 to about 0.4 weight percent, or from about 0.04 to about 0.2 weight percent based on total weight slurry at a point of use. Alternately stated, a stabilizing agent can be present at a molar concentration that is at least twice the molar concentration of the metal ion (e.g., 2 to 20 times the metal ion molar concentration, preferably about 2 to 10, or 2 to 5 times the metal ion molar concentration).

The slurry may optionally contain a nickel complexing agent, which can function chemically with materials of the slurry and of the substrate to improve removal rate of a nickel material from a substrate surface, e.g., by stabilizing nickel ions in the slurry after removal of the nickel ions from a substrate surface. Without wishing to be bound by theory, it is believed that a nickel complexing agent in the slurry can facilitate removal of nickel from a substrate surface by complexing with nickel ions that become present in the slurry (that are removed from the substrate surface) during the removal process. Useful nickel-complexing agents include amino acids and carboxylic acids, including glycine, alanine, aspartic acid, histidine, nitriloacetic acid, iminodiacetic acid, acetic acid, tartaric acid, citric acid, oxalic acid, lactic acid, glutaric acid, maleic acid, gluconic acid, malonic acid and glycolic acid. Nickel-complexing agent may be included in a slurry in any useful amount, for example in an amount of about 0.3 to about 6 weight percent, for example from about 0.3 to about 1 weight percent, based on total weight slurry, at a point of use.

A slurry as described may be prepared by known methods, such as by combining ingredients or components as described, with mixing, to provide a liquid slurry that contains, consists of, or consists essentially of the abrasive particles uniformly suspended in liquid carrier (the liquid carrier preferably being in the form of a uniform solution), with other optional slurry ingredients as described herein. Useful methods of preparation include batch, semi-batch, and continuous process. Generally, the slurry may be prepared by combining the components thereof in any order with sufficient mixing to provide uniformity.

Many commercial slurry products are provided in the form of an abrasive particle slurry concentrate that is intended to be diluted with an appropriate amount of water to form a "use composition" or "point of use slurry" before use in CMP processing, e.g., by an end user of the slurry, optionally at or near a point of use. In these embodiments, the abrasive particle slurry concentrate may include the abrasive particles in a liquid medium (liquid carrier), either alone or in combination with one or more other components of the slurry that are desired at a point of use.

In certain embodiments of slurry products for processing a hard disk (e.g., containing a nickel surface), a first concentrate that contains the abrasive particles (i.e., an abrasive particle slurry concentrate, or "slurry concentrate" for short) may be provided in a first package, with some or all of the other components of a point of use slurry being provided separately, e.g., together in a second package. Some or all of the non-abrasive particle components may be provided separately from a slurry concentrate that contains the abrasive particles, e.g., in a second composition such as a "chemistry concentrate" that may be provided in a separate (second) package and may also optionally be in a concentrated form. The second concentrate in the second package (e.g., a "chemistry pack") may include acid, metal ion catalyst, stabilizer, nickel complexing agent, etc., in relative amounts that can be combined with the abrasive particle slurry concentrate and water to produce a point of use slurry. Optionally, oxidizer (e.g., hydrogen peroxide) can also be included in a first or a second concentrate, but oxidizer may also be added as a separate component to the point of use slurry, at the point of use.

The amounts of abrasive particles and other optional components in a concentrate can be amounts that, upon dilution of the concentrate with an appropriate amount of water, each component of the slurry may be present in the slurry at the point of use, in an amount within a range recited herein for that component in a point of use slurry.

For example, abrasive particles (optionally also other components of a point of use slurry) may be present in a concentrate in an amount that is about 2 times (e.g., about 3 times, about 4 times, about 5 times, or even about 10 times) greater than a concentration of abrasive particles (or other component) specified herein, so that when the concentrate is diluted with one equal volume of water (alternately 2, 3, 4, or even 9 equal volumes of water, respectively), the abrasive particles (or other component) will be present in the slurry (at a point of use) in an amount within a range set forth herein. The concentrate can also contain an amount of water that will ensure that other components are at least partially or fully dissolved in the concentrate.

In one embodiment of an abrasive particle slurry concentrate, the concentrate can include at least 5, 10, 20, or even up to 25, 30, 40, or about 50 weight percent abrasive particles as described herein (i.e., total abrasive particles, including irregular-shaped particles and any optional additional particles in amounts) dispersed in a water-based liquid carrier. Optionally, this concentrate can include low amounts or none of any of the other components of a point of use slurry, such as, independently, less than 2, 1, 0.5, or 0.1 weight percent of metal ion catalyst, stabilizing agent, nickel complexing agent, or oxidizer, based on total weight slurry concentrate. Not containing acid, the pH of this concentrate can be above 3 or above 4, e.g., from 6 to 11.

In one embodiment of a second concentrate, such as a chemistry concentrate that need not contain abrasive particles, the second concentrate can include one or a combination of acid, metal ion catalyst, nickel complexing agent, stabilizer, etc., in relative amounts that can be combined with the abrasive particle slurry concentrate and water to produce a point of use slurry. Optionally, this concentrate can include low amounts or none of any of the other components of a point of use slurry, such as, independently, less than 2, 1, 0.5, or 0.1 weight percent abrasive particles or oxidizer, based on total weight concentrate.

A slurry as described may be useful for chemical mechanical planarization of any type of CMP substrate, at any of various stages of manufacture. Example slurries can be useful in processing a non-magnetic nickel layer of a hard disk product or precursor, such as a hard magnetic disk component useful in a computer disk drive. Hard magnetic disks typically include a non-magnetic substrate base made of a flat and rigid non-magnetic material such as aluminum, glass, glass-ceramic, or another similar material. Different functional layers are applied to the base, one of which is a magnetic storage layer. Another common layer is a non-magnetic nickel layer, e.g., NiP, e.g., "electroless" nickel, which is present to provide hardness or strength to the multi-layer disk structure. Other layers may vary, with examples including one or more "underlayers" sputtered onto the plated Ni; one or more magnetic (e.g., cobalt alloy) layers sputtered onto an underlayer; a carbon protective overcoat sputtered onto a magnetic layer; and one or more lubricant layer deposited on the carbon.

The nickel layer, which may be non-magnetic and amorphous, provides a strong and hard base for added magnetic and other layers. See, e.g., U.S. Pat. Nos. 6,977,030, and 6,159,076, describing hard magnetic disks used in computer disk drives. Example nickel layers can be made of nickel phosphorus (NiP), e.g., "electroless nickel" or "electroless NiP," as those terms are known and understood in the hard disk manufacturing arts to include layers that consist of or consist essentially of nickel and phosphorus and are commonly applied to a rigid hard disk substrate by an electroless method. The nickel layer can be applied by electroless nickel plating methods, which are known, followed by an optional annealing step at high temperature.

After placing the nickel layer onto the substrate, added layers are placed over the nickel layer. But before placing those subsequent layers, the nickel layer surface must first be processed to a smooth and uniform surface that contains a low level of defects (e.g., scratches or embedded abrasive particles). A highly uniform, smooth, and low roughness surface of the nickel layer is required for reliable performance of the hard disk.

According to the present description, processing a nickel layer surface to provide a smooth and uniform surface having a low level of defects can be performed by chemical-mechanical processing using a slurry as described, that includes highly irregular-shaped fused silica particles and optional additional particles as described herein. A useful CMP process can involve a CMP apparatus having a platen, which, in use, is in motion and has a velocity that results from orbital, linear, or circular motion. A polishing pad contacts the platen and moves with the platen. A carrier holds a substrate to be polished by contacting and moving a surface of the substrate relative to a surface of the polishing pad. Processing of the substrate surface takes place by the substrate surface being placed in contact with the polishing pad and the abrasive slurry while the polishing pad moves relative to the substrate surface to abrade at least a portion of the substrate surface. The carrier of the CMP apparatus provides controllable pressure on the substrate, pressing the substrate against the polishing pad. Relative motion of the substrate and pad abrades and removes material from the surface of the substrate. Removal of material from the substrate surface may be based on the combined effects of the chemical activity of the slurry (e.g., by catalyst, oxidizing agent, etc., present in the slurry), and the mechanical activity of the pad and the abrasive particles suspended in the slurry.

A CMP process may be performed using any suitable polishing pad (e.g., polishing surface). Suitable polishing pads include, for example, woven pads, non-woven polishing pads, polymeric (e.g., foam) polishing pads, and the like, many examples of which are known and commercially available. Pads suitable for processing a nickel-phosphorus surface can be constructed of suitable polymers of desired density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

According to preferred embodiments of slurries and CMP processes that involve a slurry with highly irregular-shaped fused silica abrasive particles as described, a nickel layer can be processed by CMP processing in a manner that produces a relatively high removal rate of the nickel material (e.g., NiP, electroless nickel) as compared to a CMP process that treats an identical substrate using identical CMP conditions, but with a comparable slurry, wherein the comparable slurry is identical to an inventive slurry except that the abrasive particles of the comparable slurry contain rounded (e.g., spherical) abrasive particles in place of the highly irregular-shaped fused silica abrasive particles. For example, according certain embodiments of the inventive methods a removal rate of NiP (using an inventive slurry) can be at least 2 percent, 5 percent, 7 percent, or 10 percent greater than a removal rate of a comparable method wherein the substrate, CMP equipment and process parameters, slurry, and abrasive particles are the same except that the abrasive particles in the similar method do not contain any highly irregular-shaped fused silica abrasive particles of the inventive slurry.

As a starting material for CMP processing, the nickel surface can be a surface of a layer of nickel material (e.g., NiP, electroless NiP) previously deposited onto a base substrate, optionally following a step of annealing the deposited nickel layer (for stress relief, at elevated temperature of at least about 200 degrees Celsius), but prior to any step of processing the surface to remove, planarize, or polish the nickel layer surface (i.e., the "deposited" nickel layer surface). This deposited nickel layer surface will have surface properties that must be improved before a subsequent layer of material can be added. For example, prior to processing by chemical mechanical processing, a deposited nickel layer surface may have a microwaviness of at least about 30 angstroms, measured by incidence interferometry, such as by using a Zygo NewView 100 wafer inspection device from Zygo Corp. (Middlefield, Conn.), at 80-500 µm wavelength. Microwaviness is linearly correlated with surface roughness, which can be determined using optical or physical techniques.

According to various methods of CMP processing, a deposited nickel layer may typically be processed by multiple substantially discrete CMP processing steps, in preparing the surface for processing by adding another layer of material onto the nickel layer. Typically, in current manufacturing processes, processing the nickel layer surface includes two or more steps, before another layer of material is added, including: a first step that is a relatively aggressive step that performs at a relatively high removal rate (often referred to as a "bulk removal step"), followed by one or more subsequent ("fine" or "polishing") steps that provide a desirably smooth and uniform surface.

In more detail, a method that includes more than one planarization, polishing, or CMP processing step includes what can be referred to as a "first step" performed on a surface of the deposited nickel layer (e.g., NiP, electroless NiP), meaning a first such step (CMP, polishing, or planarization) that is performed after the nickel layer is deposited onto a base substrate, or following an optional step of annealing the nickel layer after deposition of the nickel layer. A "first step" requires a relatively high removal rate of the NiP material to achieve high manufacturing throughput of the multi-layer hard disk structure. To achieve a sufficiently high removal rate in a first step, abrasive particles included in the slurry are often chosen to include relatively hard particles such as alumina particles. But hard particles such as alumina tend to produce undesirably high levels of scratching and the possibility of embedded particle defects. To avoid scratching and embedded particle defects, the amount of alumina particles in a slurry for processing a NiP substrate may desirably be reduced or eliminated. Desirably, the micro-waviness of the nickel layer surface may be reduced to a value of from about 2 to about 5 angstroms after a "first step" or "bulk step."

A slurry as described herein can provide a removal rate of NiP that is sufficiently high to allow for use of the slurry in a first step of processing a deposited NiP surface, even with reduced levels of alumina particles in the slurry or with no alumina particles. Accordingly, as mentioned previously herein, a useful slurry as described herein (containing the irregular-shaped abrasive particles and optional additional particles) for processing a nickel-phosphorus surface (even in a first step of processing a deposited nickel layer) may contain a relatively low amount of alumina particles (e.g., less than 30 weight percent, e.g., less than 20 weight percent, or less than 10 weight percent, based on total weight abrasive particles in the slurry) and may be an "alumina-free" slurry that contains not more than 3, 2, or 1 percent, e.g., not more than 0.5, 0.1, 0.05, or 0.01 alumina particles based on total weight abrasive particles in the slurry.

Following a "first step" of a multi-step process, one or more subsequent, different, CMP processing steps can be performed to provide a fine (polished) finish. The subsequent step or steps are performed at a lower removal rate relative to the first step. Relative to a "first step," a subsequent "fine" step or "polishing" step may be performed using a relatively softer CMP pad that may include a smaller pore size compared to a pad used in a first step. The pressure used during a subsequent step may be slightly lower compared to the pressure used in a first step. Also, a first step may use a slurry that includes relatively larger abrasive particles, compared to a subsequent (fine) step. Desirably, the micro-waviness of the nickel layer surface may be reduced to a value of less than about 2 angstroms, e.g., less than 1.5 or 1.2 angstroms, after one or more subsequent (fine, or polishing) CMP steps.

The advantages of the CMP compositions as described present invention are illustrated in the following examples, which demonstrate useful or advantageous features of inventive compositions, but of course, should not be construed as in any way limiting its scope.

Example 1

This example illustrates the Dcircle/Dmax shape analysis of three types of silica particles; spherical, irregular shaped and highly irregular shaped.

Scanning electron microscope images of samples of the different particle types were collected and measurements were made for a number of the particles. Dmax is the dimension of the longest line that can be drawn between two points in the particle, measured in nm. Dcircle was calculated by the following formula.

$$Dcircle = 2*\sqrt{(Area/\pi)}$$

The results shown in Table 1 indicate that the Dcircle/Dmax shape analysis was significantly different from the spherical and irregular shaped silicas.

TABLE 1

| Sample | # particles measured | Dcircle/Dmax |
|---|---|---|
| Spherical | 70 | 0.962 +/− 0.036 |
| Irregular | 70 | 0.899 +/− 0.068 |
| Highly irregular | 393 | 0.744 +/− 0.077 |

Example 2

This example illustrates the effect of highly irregular-shaped fused silica abrasive in polishing composition on the removal rates and polishing quality of nickel-containing substrates. Sample hard disk drive substrates with a deposited nickel surface were polished using a 16B Speedfam Double Side Polisher and a CR200 pad (30 disks were polished in each run at a slurry flow rate of 500 ml/min), or Strasbaugh 6EE and a CX270 pad (25 disks were polished in each run at a slurry flow rate of 400 ml/min). Weight measurements were performed on 5 sample disks to determine the removal rate (RR) (mg/min) for the different processes with various slurries. The microwaviness (µWa) measurements were determined on a Zygo NV100 (Zygo Corporation, Middlefield, Conn.). The full surface waviness (FSWa) was determined on an OptiFLAT substrate tester from ADE Phase Shift, Inc. (Tucson, Ariz.). The slurries consisted of (a) silica (variable, see tables below), (b) hydrogen peroxide (1.2 wt. % of the polishing composition at point of use), (c) nickel complexing agent (chelators), (d) pH adjustor to a final pH of 1.50 (phosphoric acid,). The results are listed in the following tables.

TABLE 2

| Composition | RR | µWaS | RR % | µWaS % |
|---|---|---|---|---|
| DIW/chelators/1.1 wt. % Particle B + 5.9 wt. % Particle A/ pH adjustor/H2O2 (Control) | 27.6 | 1.94 | — | — |
| DIW/chelators/1.1 wt. % Particle C + 5.9 wt. % Particle A/ pH adjustor/H2O2 (Inventive) | 34.4 | 2.19 | 25% | 13% |

TABLE 3

| Composition | RR | μWaS | RR % | μWaS % |
|---|---|---|---|---|
| DIW/chelators/1% Particle B + 6% Particle A/pH adjustor/H2O2 (Control) | 30.0 | 2.14 | — | — |
| DIW/chelators/1.1 wt % Particle B + 1.1 wt % Particle C + 4.8 wt. % Particle A/pH adjustor/H2O2 (Inventive) | 37.2 | 2.17 | 25% | 1.4% |

TABLE 4

| Composition | RR | FSWa (nm) | RR % | FSWa % |
|---|---|---|---|---|
| DIW/chelators/5.9 wt. % Particle B + 1.1 wt. % Particle A/pH adjustor/H2O2 (Control) | 34.8 | 0.44 | — | — |
| DIW/chelators/5.9 wt. % Particle B + 1.1 wt. % Particle C + 1.1 wt. % Particle A/pH adjustor/H2O2 (Inventive, loading 1) | 43.9 | 0.53 | 26% | 20.4% |
| DIW/chelators/5.9 wt. % Particle B + 2.2 wt. % Particle C + 1.1 wt. % Particle A/pH adjustor/H2O2 (Inventive, loading 2) | 44.2 | 0.49 | 27% | 11.4% |

TABLE 5

| Description | RR | FSWa (nm) | μWa-short | RR % | FSWa % | μWa-short |
|---|---|---|---|---|---|---|
| 1.12 wt. % Particle B + 5.88 wt. % particle A (Control) | 31.46 | 0.3 | 2.43 | — | — | — |
| 1.12 wt. % Particle C + 5.88 wt. % particle A (Inventive) | 35.74 | 0.38 | 2.52 | 13.6% | 26.7% | 3.7% |
| 1.12 wt. % Particle C + 0.56 wt. % Particle B + 5.88 wt. % particle A (Inventive) | 35.36 | 0.38 | 2.33 | 12.4% | 26.7% | −4.1% |
| 1.12 wt. % Particle C + 1.68 wt. % Particle B + 5.88 wt. % particle A (Inventive) | 36.78 | 0.31 | 2.22 | 16.9% | 3.3% | −8.6% |

TABLE 6

| Code | Morphology | Size | Characteristic |
|---|---|---|---|
| Particle A-primary particle | Cocoon shape | 100-150 nm | |
| Particle B | Spherical shape | 70-120 nm wide size distribution | |
| Particle C | Highly irregular-shape fused silica | 300-600 nm | Density > density of Particle A and Particle B |

The results indicate that slurries containing Particle C, which is a highly irregular-shaped fused silica particle, and the exemplary slurry chemistry, achieved a significant improvement in removal rate (RR) without compromising other performance features (e.g., FSWa Full surface waviness, microwaviness), as compared to other silica CMP slurries that do not contain the highly irregular-shaped fused silica abrasive particles, for polishing a nickel surface of a memory hard disk substrate. In Tables 2 and 3, removal rates were improved but microwaviness remain comparable when Particle C was included in the slurry, with a total abrasive concentration held constant at 7 wt. %. In Table 4, two loading levels of Particle C were used; 13.5% and 23.9% of total abrasive concentration. Both loading levels of Particle C resulted in improved removal rates compared to the control, with a no trade off in microwaviness. In Table 5, the total amount of Particle C remained the same at 1.12 wt. % of the slurry, but the total amount of abrasive increased, for example 7, 7.56 and 8.68 wt. % of the slurry. The results showed a significant increase in removal rate and improvement on full surface waviness (FSWa) and microwaviness.

The invention claimed is:

1. A chemical-mechanical polishing composition comprising:
    liquid carrier,
    about 0.5 to 12 weight percent abrasive particles comprising highly irregular-shaped fused silica abrasive particles, wherein at least half of the surfaces of the highly irregular shaped fused silica are non-rounded, non-smooth, bumpy, or rough, and have a cornered or angular edge,
    the composition further comprising one or more of a metal ion accelerator, stabilizer, nickel complexing agent, chelating agent, and pH control agent, and
    optionally, an oxidizing agent.

2. The polishing composition of claim 1 wherein the highly irregular-shaped fused silica abrasive particles have an average particle size in a range from 50 to 2000 nanometers.

3. The polishing composition of claim 1 wherein the highly irregular-shaped fused silica abrasive particles have an average particle size in a range from 100 to 1000 nanometers.

4. The polishing composition of claim 1, further comprising abrasive particles selected from the group consisting of silicon nitride, titanium oxide, thorium oxide, alumina, yttria, zirconia, diamond, and ceria.

5. The polishing composition of claim 1 further comprising colloidal silica particles.

6. The polishing composition of claim 5 wherein the polishing composition contains:
    from 10 to 40 parts by weight of the highly irregular-shaped fused silica abrasive particles, and
    from 60 to 90 parts by weight colloidal silica particles, based on 100 parts by weight total abrasive particles in the slurry.

7. The polishing composition of claim 5 wherein the polishing composition contains, from 0.1 to 10 weight percent of the highly irregular-shaped fused silica abrasive particles, and up to 25 weight percent colloidal silica particles, based on total weight slurry.

8. The polishing composition of claim 5 wherein the polishing composition contains at point-of-use:

from 0.1 to 5 weight percent of the highly irregular-shaped fused silica abrasive particles, and from 1 to 10 weight percent colloidal silica particles, based on total weight slurry.

9. The polishing composition of claim 5 wherein the polishing composition is a concentrate and contains:

from 5 to 40 weight percent of the highly irregular-shaped fused silica abrasive particles, and from 10 to 50 weight percent colloidal silica particles, based on total weight slurry.

10. The polishing composition of claim 1 having a pH below about 3.

* * * * *